(12) United States Patent
Watters

(10) Patent No.: US 8,664,514 B2
(45) Date of Patent: Mar. 4, 2014

(54) MULTIPLEXING SOLAR LIGHT CHAMBER

(76) Inventor: George M. Watters, Spokane, WA (US)

( * ) Notice: Subject to any disclaimer, the term of this patent is extended or adjusted under 35 U.S.C. 154(b) by 1001 days.

(21) Appl. No.: 12/574,180

(22) Filed: Oct. 6, 2009

(65) Prior Publication Data

US 2010/0089436 A1   Apr. 15, 2010

Related U.S. Application Data

(60) Provisional application No. 61/104,951, filed on Oct. 13, 2008.

(51) Int. Cl.
*H01L 31/052* (2006.01)
*H01L 31/048* (2006.01)
*G02B 17/00* (2006.01)

(52) U.S. Cl.
CPC .............. *H01L 31/0522* (2013.01); *Y02E 10/52* (2013.01)
USPC ............................. 136/246; 136/251; 359/730

(58) Field of Classification Search
USPC ........................................................ 359/730
See application file for complete search history.

(56) References Cited

U.S. PATENT DOCUMENTS

| | | | |
|---|---|---|---|
| 2,402,662 A | 6/1946 | Ohl | |
| 3,427,200 A | 2/1969 | Lapin et al. | |
| 4,115,149 A | 9/1978 | Bell | |
| 4,169,738 A | 10/1979 | Luque | |
| 4,312,330 A | 1/1982 | Holdridge | |
| 4,604,494 A | 8/1986 | Shepard, Jr. | |
| 4,907,864 A | 3/1990 | Hagerty et al. | |
| 5,374,317 A | 12/1994 | Lamb et al. | |
| 5,409,550 A | 4/1995 | Safir | |
| 5,431,742 A | 7/1995 | Kleinerman | |
| 5,554,229 A | 9/1996 | Vogeli | |
| 5,990,413 A | 11/1999 | Ortabasi | |
| 6,008,449 A | 12/1999 | Cole | |
| 6,061,175 A | 5/2000 | Watters | |
| 6,087,579 A | 7/2000 | Muskatevc | |
| 6,091,017 A | 7/2000 | Stern | |
| 6,225,551 B1 | 5/2001 | Lewandowski et al. | |
| 6,274,860 B1 | 8/2001 | Rosenberg | |
| 6,323,415 B1 | 11/2001 | Uematsu et al. | |
| 6,323,996 B1 | 11/2001 | Watters | |
| 6,541,694 B2 | 4/2003 | Winston et al. | |
| 6,964,486 B2 | 11/2005 | Rabinowitz | |
| 7,000,608 B2 | 2/2006 | Löscgmann | |
| 7,238,878 B2 | 7/2007 | Gonsiorawski | |
| 7,394,016 B2 | 7/2008 | Gronet | |
| 2004/0084077 A1* | 5/2004 | Aylaian | 136/246 |
| 2004/0246605 A1 | 12/2004 | Stiles et al. | |
| 2005/0121071 A1 | 6/2005 | Repetto et al. | |
| 2006/0072222 A1 | 4/2006 | Lichy | |
| 2007/0137690 A1 | 6/2007 | Bruning et al. | |
| 2007/0137691 A1 | 6/2007 | Cobb et al. | |
| 2007/0227582 A1 | 10/2007 | Chen et al. | |

(Continued)

*Primary Examiner* — Jennifer Michener
*Assistant Examiner* — Christopher Danicic

(57) ABSTRACT

Described is a light chamber for amplifying solar radiation for purposes of generating electricity using photovoltaic panels. The light chamber includes a housing; a photovoltaic panel disposed within the housing; a plurality of wedge-shaped reflectors disposed within the housing configured to rotate along one or two axes and can be directed by an integrated circuit controller; a dome lens affixed to the upper end of the housing; a fresnel lens disposed between the dome lens and the photovoltaic panel; a reflector disposed around the inner surface of the housing; and another reflector disposed at or near the lower end of the housing.

8 Claims, 7 Drawing Sheets

(56) References Cited

U.S. PATENT DOCUMENTS

| | | |
|---|---|---|
| 2007/0256725 A1 | 11/2007 | Fork et al. |
| 2007/0289622 A1* | 12/2007 | Hecht .......................... 136/246 |
| 2008/0047605 A1 | 2/2008 | Benitez et al. |
| 2008/0115823 A1 | 5/2008 | Kinsey |
| 2008/0128016 A1 | 6/2008 | Lichy |
| 2008/0128017 A1 | 6/2008 | Ford |
| 2009/0101193 A1* | 4/2009 | Hsiao .......................... 136/246 |
| 2009/0223555 A1* | 9/2009 | Ammar ........................ 136/246 |

* cited by examiner

FIG. 10
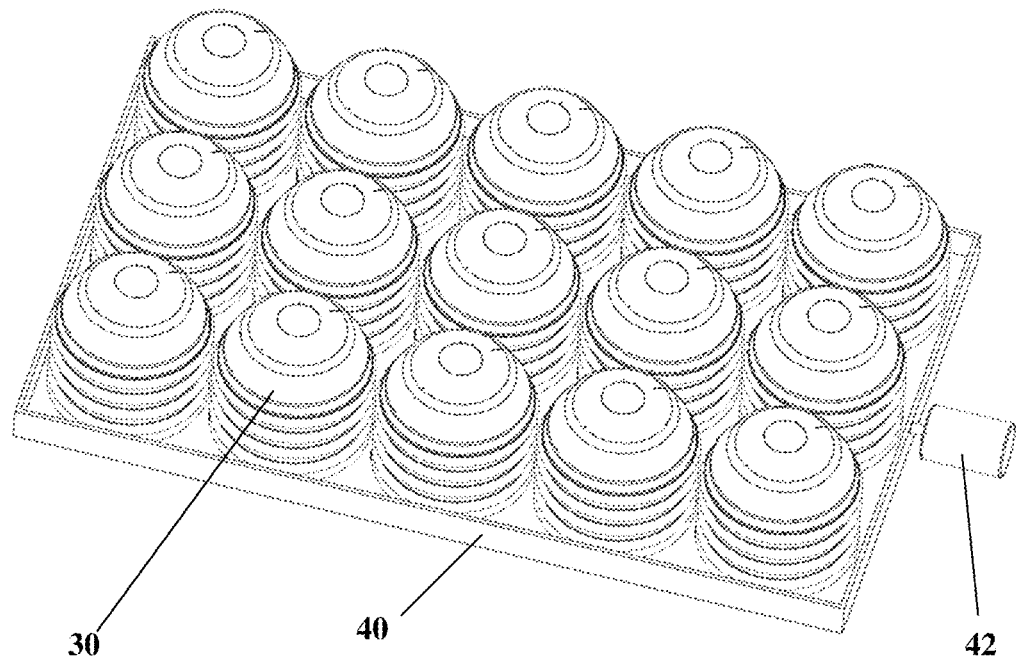
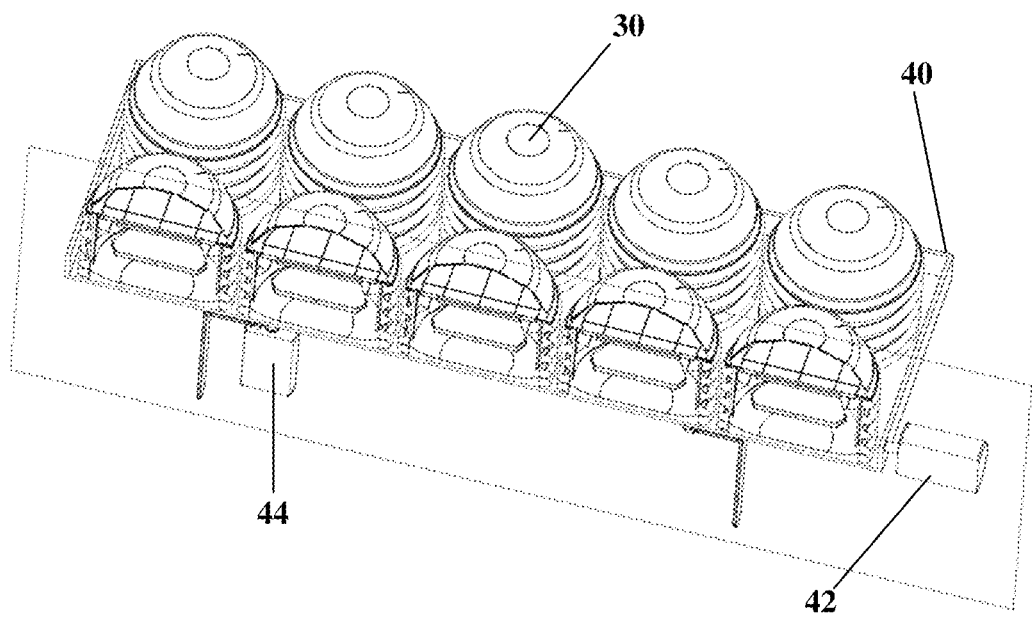
FIG. 11

MULTIPLEXING SOLAR LIGHT CHAMBER

CROSS-REFERENCE TO RELATED APPLICATIONS

Priority is hereby claimed to provisional application Ser. No. 61/104,951, filed Oct. 13, 2008, which is incorporated herein by reference.

FIELD OF THE INVENTION

The present invention generally relates to a device for collecting and concentrating light for its conversion to electricity and heat. The invention is more specifically directed to a concentrating photovoltaic system that generates increased electrical output, while occupying a small amount of space.

BACKGROUND OF THE INVENTION

The photovoltaic effect was first described in 1839 by French physicist A. E. Becquerel. However, it was not until after World War II that Russell S. Ohl invented and patented the modern junction semiconductor solar cell (in 1946). See U.S. Pat. No. 2,402,662. It was not until the mid-1970's that practical and effective gallium-arsenide (GaAs) solar cells became commercially available.

In the decades since, the science and technology related to solar energy conversion has grown considerably. Current commercially available solar arrays (i.e., photovoltaic arrays) are approaching their theoretical maximum efficiency for converting sunlight directly into electricity.

Many involved in solar energy development, deployment, and refinement believe that the use of electrical devices (motors, fans, and the like) should be minimized in the design of solar arrays because of component energy use and maintenance requirements. Although that was an appropriate strategy in the past, it no longer applies in many situations. Highly efficient, low energy and low maintenance devices have concurrently evolved dramatically since the 1970's. Evolution of integrated circuit (IC)-controlled electrical components, heat-sensing and heat-use devices, alignment tools and optics, etc. have coalesced with advancing science and technology from many fields. When the use of electrical energy to power a sub-device is the proximate cause of an increase in overall renewable-energy output, it should be considered as an optional component for renewable energy purposes.

Because solar panels themselves are converging on their theoretical maximum efficiencies, ancillary devices and processes need to be considered to improve the net electrical output of solar arrays. Further still, maintenance requirements, environmental risks, raw materials scarcity, zoning restrictions on large solar arrays, and many other factors must be considered in parallel with efforts to increase energy output from solar arrays. In short, the ultimate goal is not simply increased watts of electricity per photovoltaic installation. A great many other factors unrelated to energy output must also be included in the calculus.

A large number of U.S. patents address various aspect of improving the electrical output of solar arrays. For example:

U.S. Pat. No. 6,274,860 to Rosenberg describes a holographic planar concentrator (HPC) for collecting and concentrating optical radiation. The device is mounted in the intended orientation for collecting solar energy and at least one solar energy-collecting device is mounted along at least one edge of the holographic planar concentrator.

U.S. Pat. No. 6,087,579 to Muskatevc describes a photovoltaic array including a plurality of planar cells, arranged in panels, a light collecting body having a solar energy collecting surface adapted to be oriented for receiving solar energy in a nominal direction which defines a nominal light source direction. The panels are spaced apart from each other in a direction perpendicular to the nominal light source direction and each has an active surface oriented on the body at an angle of less than 90° relative to the nominal light source direction. The light collecting body redirects light received on the light collecting surface onto the active surfaces of the panels.

U.S. Pat. No. 5,409,550 to Safir describes a solar cell module having a housing with at least one aperture associated with a concentrator. Light energy propagated along the optical principal axis of the concentrator passes through the aperture and is concentrated on a primary photoactive area. A secondary photoactive area is also disposed in the housing so as to be illuminated by light energy which is propagated in a direction different from the optical principal axis of the concentrator.

U.S. Pat. No. 6,964,486 to Rabinowitz describes an apparatus for aligning solar concentrator micro-mirrors to maximize the percentage of incident light that is reflected to a photo-active surface.

U.S. Pat. No. 6,294,723 to Uematsu et al. describes a photovoltaic module including a plurality of concentrators each having a light-incident plane and a reflection plane, and photodetectors. Each photodetector is in contact with one of the concentrators. The module is capable of trapping light and generating power even when it is not aligned with the sun.

U.S. Pat. No. 7,000,608 to Löschmann describes a solar plant with at least two solar units. Each of the solar units includes a securing device and a swivel-located supporting structure mounted on it. The solar modules or collectors are mounted on the supporting structure, which can follow the course of the sun by way of its rotational axis.

U.S. Pat. No. 7,394,016 to Gronet describes a solar cell assembly comprising a plurality of elongated solar cells. Each elongated solar cell has an elongated conductive core configured as a first electrode, a semiconductor junction circumferentially disposed on the elongated conductive core, and a transparent conductive oxide layer disposed on the semiconductor junction. Each solar cell is bound to two corresponding metal counter-electrodes that lie in a groove running lengthwise along the solar cell. The solar cell also includes a plurality of internal reflectors. Each reflector is disposed between two of the elongated solar cells such that a portion of the solar light reflected from internal reflector is reflected onto the two elongated cells.

U.S. Pat. No. 5,990,413 to Ortabasi describes a laminated, bifacial solar cell that can receive and convert sunlight incident on either side of the solar cell. The laminate is held in a frame by high tensile cords that are strung like the cords in a tennis racket. The resulting assembly receives direct sunlight from one side and reflected light on the other side.

U.S. Pat. No. 4,169,738 to Luque describes another planar solar cell that is active on both sides. The solar cell is positioned in a solar concentrator capable of simultaneously illuminating both sides of the cell. The cell is immersed in a transparent liquid that enhances solar energy concentration and aids in removing undesirable heat from the cell. Electrically conductive metal grids serving as cathode and anode connections are formed on both sides of the cell. The grid apertures allow the light to enter into the appropriate semiconductor regions.

SUMMARY OF THE INVENTION

The present device capitalizes on the fact that photovoltaic efficiency has increased rapidly in recent years. However, intrinsic photovoltaic efficiency cannot improve indefinitely and means to concentrate solar radiation onto active surfaces is one means of improving net generation of electricity from solar installations. The utility of the present apparatus is in providing a structure to reflect various optical functions related to concentration, dispersion, motion control, and incident light ray enhancement to stimulate photovoltaic panels with differing angular orientations in relation to the most direct angle of incidence of light from the sun. Thus, the present device is a light chamber wherein radiation, preferably solar radiation, is bounced around in a highly reflective and magnified manner. Photovoltaic solar arrays or panels are strategically placed within the light chamber to maximize the amount of radiation impinging upon the active surfaces.

The sun-facing plane of the device houses panels with direct light input. The orientation of the sun-facing plane may be controlled by conventional two-axis solar trackers. The system also houses photovoltaic panels opposite the sun-facing plane and placed in other angles or curves not directly facing the sun. In many implementations this allows much higher wattage output from a smaller defined geographical area than conventional concentrating photovoltaic systems. Because the present device is much smaller per watt of output, it can be used with greater acceptance in urban and suburban settings.

The primary purpose of the invention is to reduce the footprint, tracking requirements, and overall cost per delivered watt for electrical output from solar cell arrays in relation to sun exposure. A secondary benefit of the device is the creation of useable heat resulting from magnified and concentrated reflective-light. This heat can be used, for example, for residential or commercial heating purposes.

The device described herein utilizes a combination of motion-controlled concentrating, dispersing, and reflective filtering optics in combination with a highly internally-reflective light chamber that permits multi-directional light-ray access, control, and splitting for distribution to solar panels placed at various orientations within the light chamber.

Any type of photovoltaic array can be used in combination with the present device, in series or parallel configurations. For example, flexible-, thin-, and/or rigid-framed photovoltaic panels can be disposed together within a cylindrical light chamber, thereby maximizing the efficient use of space for purposes of generated electricity from sunlight.

When the device is used in combination with solar tracking devices, it produces electricity both from direct impingement of perpendicular light rays onto a top-most solar array, but also creates additional reflective light that is directed onto photovoltaic panels or flexible arrays which are in opposing and/or tangential relationships to the axis of the sunlight.

The device thus generates increased electrical output on a per-unit (or per solar-tracker) basis than conventional solar arrays. The present device is also extremely space efficient. Because the device is both efficient in terms of generating electricity and efficient in terms of space used, the total cost to generate the electricity is reduced due to the decreased need for solar trackers per desired electrical output. Because the light chamber also generates heat, methods are described to deal with that heat in a utilitarian manner.

The device has a unique "plug and play" modular design that allows it to be easily customized for specific installations or electrical output requirements. The reflective light chamber is dimensioned and configured to enable variable light concentration, dispersion, and filtering. This enables solar panels of almost any configuration to be used in combination with the light chamber. There are various other industries (macro to micro) in which complimentary product interfaces to this invention exist.

The present device also greatly reduces the weight of the device per watt of electricity generated by making smart use of vertical space. The solar panels used in the device can be disposed in multiple horizontal plans, stacked vertically, thereby making maximum use of vertical space. This reduces the need for large glass panels and the corresponding structural supports and machinery needed to orient large panes appropriately. Of particular note is that the housing makes rigid glass encapsulation unnecessary for the solar arrays contained within the light chamber.

The device multiplies the output of solar panels of any shape, size, or configuration. While the output of some shapes and sizes of panels are more effectively increased than others, output of all panel configurations is increased by their volumetric distribution within the light chamber and the magnification of light that takes place within the light chamber.

Another advantage of the present light chamber is that it makes maximum use of vertical space, a consideration often overlooked in the design of photovoltaic panels. Through a judicious arrangement of refracting and reflecting surfaces, the light chamber allows solar panels to be stacked vertically on top of one another, while still directing a sufficient amount of the sun's energy onto the panels to generate electricity in a cost-effective fashion.

The stacking of the solar panels within the light chamber also results in a device having a small surface exposed to the sun in comparison to the amount of electricity generated per unit. In short, the light chamber makes use of volume using superimposed photovoltaic surfaces. This is beneficial for several reason. First, from a land-use standpoint, the light chamber allows massive amounts of solar energy to be generated from a much smaller physical installation. Additionally, reflective and refractive surfaces in any solar-powered installation must be kept clean to operate efficiently. (A dirty minor simply does not reflect light as well as a clean mirror.) In large photovoltaic installations, especially in desert climates, finding and distributing water for cleaning purposes is a critical issue. One of the primary factors driving the development of solar energy is concern for environmental damage due the combustion of fossil fuels. But a large-scale solar array in the desert creates its own environmental problem if wells must be drilled or pipelines installed to bring needed washing water and/or process water to the installation. In the present invention, only the upper dome lens needs to be washed because all of the photovoltaically active surfaces are sealed within the light chamber.

Cost per watt generated using the present device is advantageously decreased due to a confluence of several factors. These factors include reduced manufacturing and shipping costs for the required components; reduced need for solar tracking devices (especially when using crystalline photovoltaic panels); decreased transportation and distribution expenses (due to the ability to site the devices essentially at the point of need, or much closer to the point of need); and the ability to control, store, and utilize heat generated by the device.

Thus, a first version of the invention is directed to a light chamber comprising a housing having an upper end, a lower end, and an inner surface. At least one photovoltaic panel is disposed within the housing. A dome lens is affixed to the upper end of the housing. A first reflector is disposed around all or substantially all of the inner surface of the housing. A second reflector is disposed at or near the lower end of the housing and configured to reflect light entering the housing onto the photovoltaic panel. The photovoltaic panel generally comprises an upper face and a lower face. The second reflector is configured to reflect light entering the housing onto the lower face of the photovoltaic panel. The photovoltaic panel may be planar or non-planar.

Optionally, a fresnel lens may be disposed between the dome lens and the photovoltaic panel.

In another version of the light chamber, in addition to the elements noted previously, it comprises at least one wedge-shaped reflector mounted to the inner surface of the housing and dimensioned and configured to reflect light entering the housing onto the photovoltaic panel.

The light chamber may also comprise a plurality of planar photovoltaic panels disposed in registration (i.e., stacked) within the housing, and a plurality of wedge-shaped reflectors mounted in pairs to the inner surface of the housing, a first pair of wedge-shaped reflectors mounted proximate to the an upper end of the housing, and a second pair of wedge-shaped reflectors mounted proximate to the lower end housing. The housing may be circular in cross-section, in which case a first pair of wedge-shaped reflectors may be mounted 180° opposed from each other, and a second pair of wedge-shaped reflectors may be mounted 180° opposed from each other and 90° offset form the first pair of wedge-shaped reflectors.

Where more than one photovoltaic panel is present, the light chamber may further comprise a fresnel lens that completely encapsulates at least one of the photovoltaic panels.

In another version of the invention, the wedge-shaped reflectors are rotatably mounted to the inner surface of the housing. The light chamber may optionally further comprise a heat exchanger operationally connected to it.

Yet another version of the light chamber comprises a housing having an upper end, a lower end, and an inner surface. A dome lens is affixed to the upper end of the housing. A fresnel lens is disposed within the housing. A first reflector is disposed around all or substantially all of the inner surface of the housing. A second reflector disposed at or near the lower end of the housing and configured to reflect light entering the housing toward the upper end of the housing. A plurality of wedge-shaped reflectors is rotatably mounted to the inner surface of the housing.

BRIEF DESCRIPTION OF THE FIGURES

FIG. 10 is a perspective rendering of an array of light chambers according to the present invention, wherein the light chambers are disposed in a solar tracker.

FIG. 11 is a vertical cross-section (in perspective) through the rendering shown in FIG. 10.

DETAILED DESCRIPTION OF THE INVENTION

At the heart of the present device is a concentrating photovoltaic system that is compact, cost-effective, modular, efficient, and decreases the need for large-area solar array installations and multiple solar trackers. The device generates more electricity per area of active photovoltaic surface (and per overall unit area) than conventional solar arrays.

Figure 1:
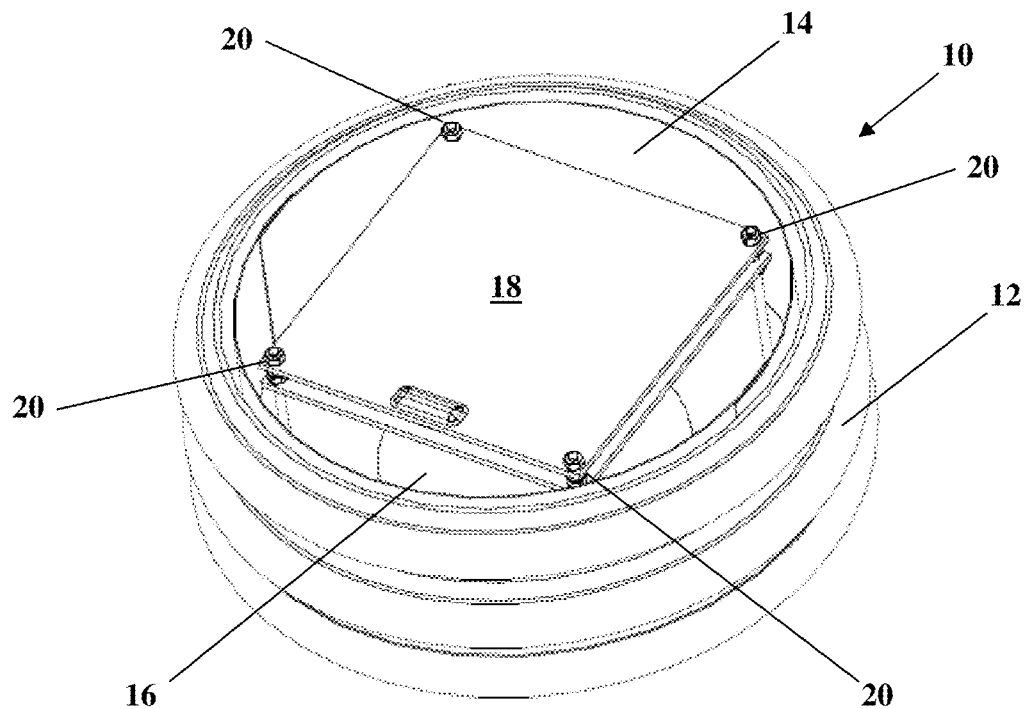
FIG. 1 is a perspective rendering of a first version of a light chamber or concentrating photovoltaic system according to the present invention.
Figure 2:
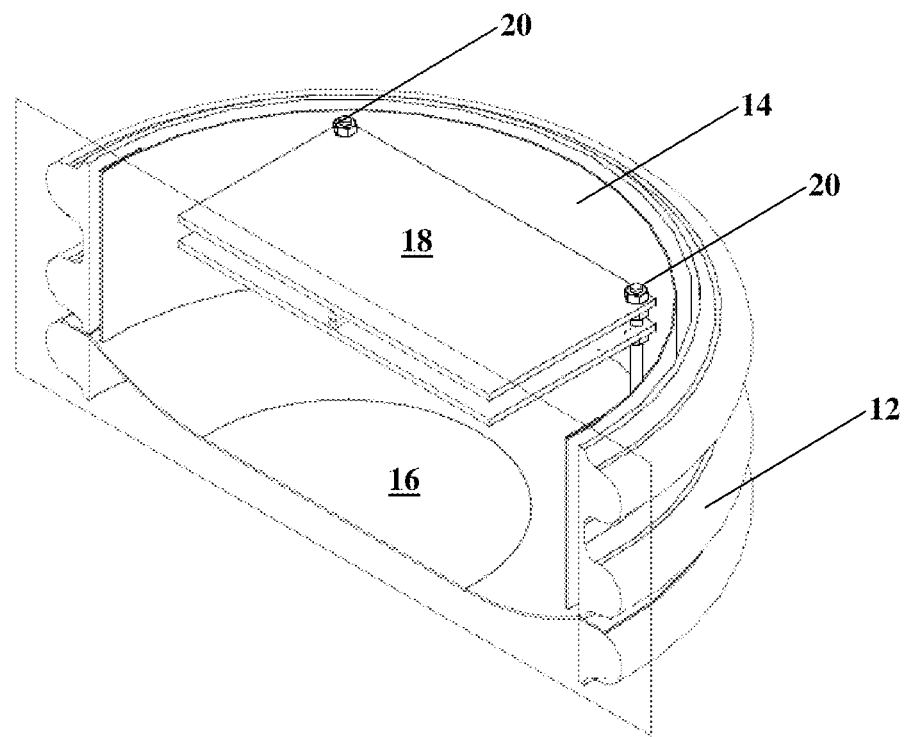
FIG. 2 is a vertical cross-section, in perspective, through the rendering shown in FIG. 1.

Throughout all of the drawing figures, the same reference numerals refer to the same or analogous elements of the device. Referring now to FIGS. 1 and 2, these two figures illustrate a first version 10 of the invention. FIG. 1 is a perspective view of the first version of the device, and FIG. 2 is a vertical cross-sectional view of the rendering shown in FIG. 1. A cylindrical housing or case 12 having inner and outer surfaces and top and bottom faces encloses at least one solar panel 18. A circumferential sidewall reflector 14 is disposed on or proximate to the inner surface of the housing. Preferably, the sidewall reflector 14 covers all or substantially all of the inner surface of the housing 12. As shown in FIGS. 1 and 2, the sidewall reflector 14 is made of two pieces, which can be rotated around the inner surface of the housing 12. A bottom reflector 16 covers the bottom face of the cylindrical housing 12. The top face of the housing may be open and exposed to the sun, or covered by a dome lens 32 (omitted in FIGS. 1 and 2 for clarity, but shown in FIG. 3). The solar panel 18 (and its electrical connecting leads, omitted for clarity) is fixed (preferably reversibly) within the housing via fasteners 20. The fasteners are of conventional design, and can be any type of fastener now known or developed in the future, for example (and without limitation), nuts and mating bolts, machine screws, friction-type fasteners, hook and eye-type fasteners (e.g., "VELCRO"-brand fasteners), rivets, tab and slot-type fasteners, and the like.

The device functions to concentrate radiation, preferably solar radiation, onto the photovoltaic surfaces of solar panel 18. Sunlight (used herein synonymously with "radiation") enters the open top face of the housing 12 and directly strikes the upper active surface of the solar panel 18. Sunlight that does not impinge directly onto the upper surface of solar panel 18 is reflected off bottom reflector 16 and sidewall reflector 14 onto the lower active surface of the solar panel 18. Albedo from the solar panel 18 is also reflected back toward the solar panel 18 by bottom reflector 16 and sidewall reflector 14. In this fashion, a greatly increased amount of solar energy impinging upon the device 10 is converted into electrical energy by directing a much larger fraction of the light onto the photovoltaic surfaces of the solar panel 18. By concentrating the sunlight onto the active areas of the solar panel 18, the device 10 decreases the solar cell area required to achieve a given electrical output, while also optimizing the efficiency of the solar panel 18. That is, most solar panels exhibit a positive relationship between radiation flux impinging on the active surface and photovoltaic efficiency.

The device 10 provides a host of advantages, including the potential for solar cell efficiencies greater than 40%. The device has no intervening heat transfer surfaces. The device is both modular and scalable to a wide range of size. The device functions at near-ambient temperatures, and excess heat generated within the device can be tapped using a heat-exchanger and used for productive purposes such as heating commercial and residential buildings. The device reduces the overall cost per watt of electrical power generated due to decreasing the number of photovoltaic panels required to generate a given amount of electrical power. In short, the device enables solar panels to operate more closely to their theoretical maximum electrical output.

The latest generation of high-efficiency solar cells are very, very expensive. To justify the high capital cost of such solar cells requires using concentrated sunlight to achieve cost-effective operation. While more efficient in terms of electrical output, the most advanced solar cells do not generate a sufficiently greater output to justify their cost when using unamplified sunlight.

Any type of photovoltaic cell, array, or panel 18, now known or developed in the future may be used in the present device. (The terms solar cell, solar array, solar panel, photovoltaic cell, photovoltaic panel, and photovoltaic array are used synonymously herein.) Suitable solar cells can be fabricated, in well-known fashion, from amorphous, mono-crystalline and/or multi-crystalline silicon. Mono-crystalline silicon panels can be made via the Czochralski process and the Bridgman-Stockbarger technique, both of which are routinely used in the semiconductor and photovoltaic fields. Solar panels may also be fabricated by other means, such as solution deposition, chemical vapor deposition, magnetron sputtering, and electroplating, using conventional and well-known methods.

In terms of materials, the solar panels 18 may be fabricated from any photovoltaically active material now known or developed in the future. By way of example, and without limitation, the panels 18 may be fabricated from gallium-arsenide (GaAs), cadmium telluride (CdTe), copper indium selenide, copper indium gallium selenide, amorphous silicon, micromorphous silicon, nanomorphous silicon, crystallin silicen, and the like. Typically, these materials are applied as a thin film to a supporting substrate such as glass or ceramics, thereby reducing material mass and therefore fabrication costs.

The panels 18 may also be dye-sensitized photovoltaic cells. See, for example, O'Regan & Grätzel (1991). "A low-cost, high-efficiency solar cell based on dye-sensitized colloidal $TiO_2$ films," *Nature* 353(6346):737-740. See also Tributsch, H. (2004) "Dye sensitization solar cells: a critical assessment of the learning curve," *Coordination Chemistry Reviews* 248:1511-1530.

Figure 8:
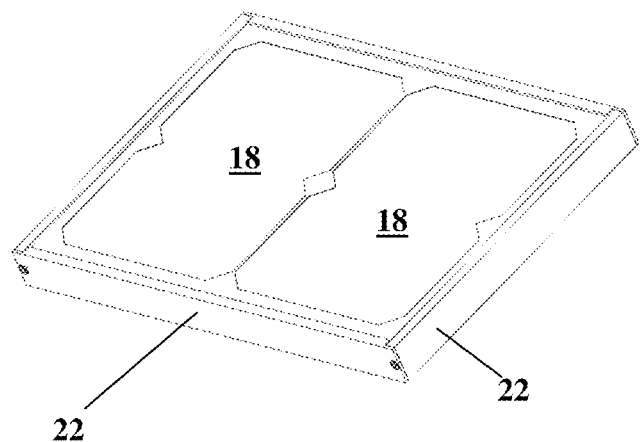
FIG. 8 is a perspective rendering of a bifacial photovoltaic panel or solar array.
Figure 9:
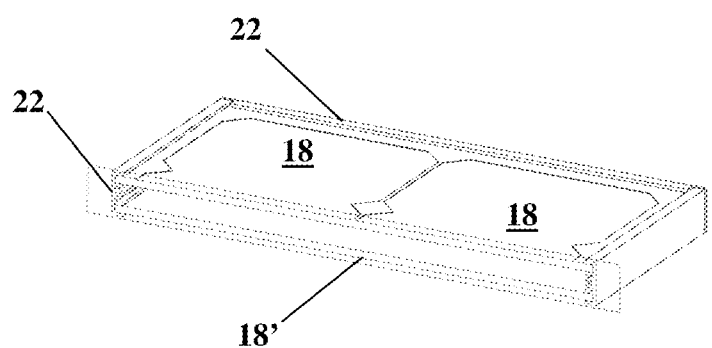
FIG. 9 is a vertical cross-section (in perspective) through the rendering shown in FIG. 8.

Referring to FIGS. 8 and 9, these figures depict a generic, bifacial solar panel for use in the present device. The panels include the actual photovoltaically active panels, an upper panel 18 and a lower panel 18', which are held in place by a rigid or semi-rigid frame 22.

The housing 12 of the device may be fabricated from any suitably rigid material, such as metal, wood, and/or thermo-setting or thermoplastic polymers. Polymeric materials are preferred for their low cost and light weight.

The reflective surfaces within the housing 12, that is bottom reflector 16 and sidewall reflector 14 may be fabricated from any reflective material now known or developed in the future, including (without limitation), suitably shaped polished metal, metallized glass, metallized molded plastic or metallized thin films (that is, a support structure made of glass, plastic, or other matter, with a layer of highly reflective material such as polished aluminum, aluminum alloy, silver, nickel, steel, etc. deposited onto the support structure). In some versions, the sidewall reflector 14 is a single piece, monolithic reflecting body that extends around the inner circumference of the housing 12. In other versions, the sidewall reflector may be fabricated from multiple subparts. The sidewall reflector may also comprise a metal or plastic support structure onto which is layered a highly reflective metal foil tape. Exemplary metal foil tapes include, but are not limited to, "3M"-brand aluminum foil tape 425, "3M"-brand aluminum foil tape 427, "3M"-brand aluminum foil tape 431, and "3M"-brand aluminum foil tape 439 (3M, St. Paul, Minn.).

The bottom reflector 16 may be fabricated from any of the reflective materials noted above for the sidewall reflector 14. It is much preferred that the bottom reflector be made from flexible, but shape-retaining film (that is, a malleable material that can be configured—either manually or using tools—to the desired shape). This allows the bottom reflector to be custom-shaped to any curvature, from concave to convex focal lengths (and any combination thereof). This allows the bottom reflector to be shaped to suit specific installations to maximize reflection onto the bottom-most solar panel, as well as productive reflections off the sidewall reflector 14. The bottom reflector 16 can adopt a broad range of designs, only one of which is illustrated in FIG. 2. Key to the design of bottom reflector 16 is that it reflects as much light as possible entering into housing 12 onto the lower surface of solar panel 18, both directly in a single reflection and indirectly due to multiple reflections in combination with sidewall reflector 14 and albedo from any other surfaces within the housing. The overall curvature of the bottom reflector 16 may be of any suitable design, such as (without limitation), spherical, parabolic, compound parabolic, ellipsoidal, or any combination of curvatures. As shown in FIG. 2, the inner, center section of the bottom reflector is parabolic, while the outer section that abuts the sidewall reflector 14 is ellipsoidal. These curvatures are exemplary only and the various reflectors within housing 12 may be dimensioned and configured in any suitable fashion to maximize the amount of direct and reflected sunlight that impinges upon both surfaces of solar panel 18.

The housing 12 is shown in FIGS. 1 and 2 as cylindrical and the solar panel 18 is depicted as planar. Both the housing 12 and the solar panel 18, however, may adopt any geometric shape or cross-section, without limitation. Thus, the housing could define a regular or irregular polygon (i.e., triangular, rectangular, square, pentagonal, hexagonal, etc.) Likewise, the solar panel 18 may be fabricated from flexible, thin-film photovoltaic materials, in which case the solar panel itself may be curved or shaped in any fashion.

Figure 3:
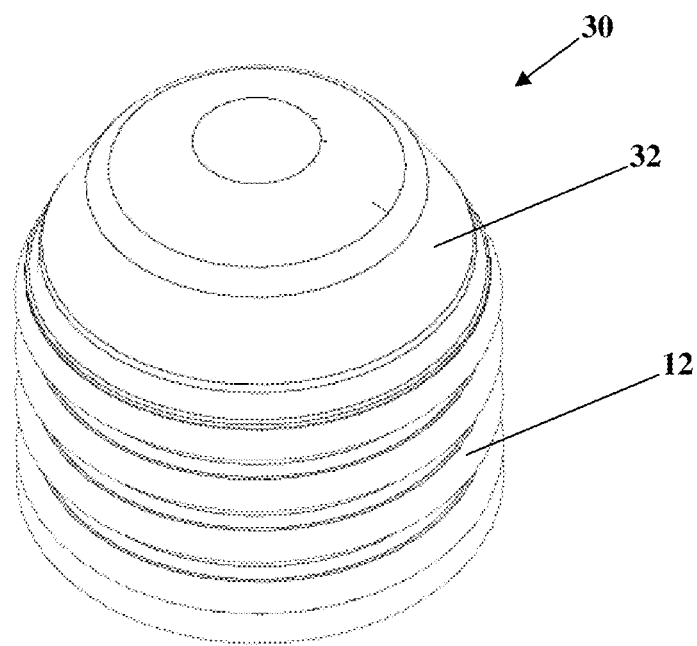
FIG. 3 is a perspective rendering of a second version of a light chamber or concentrating photovoltaic system according to the present invention.
Figure 4:
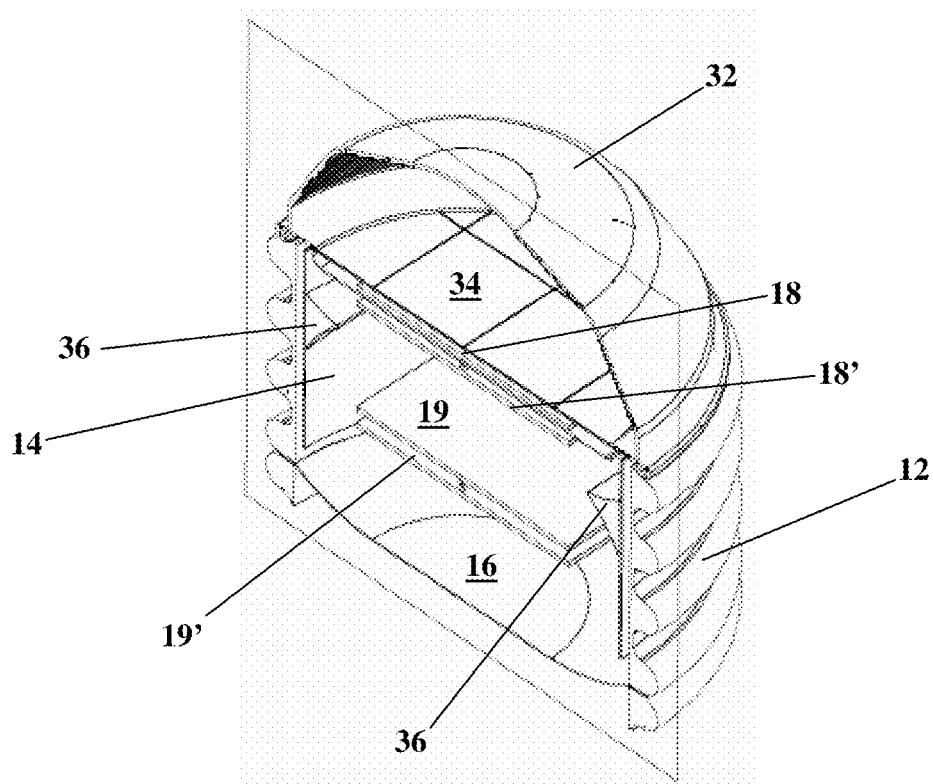
FIG. 4 is a vertical cross-section (in perspective) through the rendering shown in FIG. 3.
Figure 5:
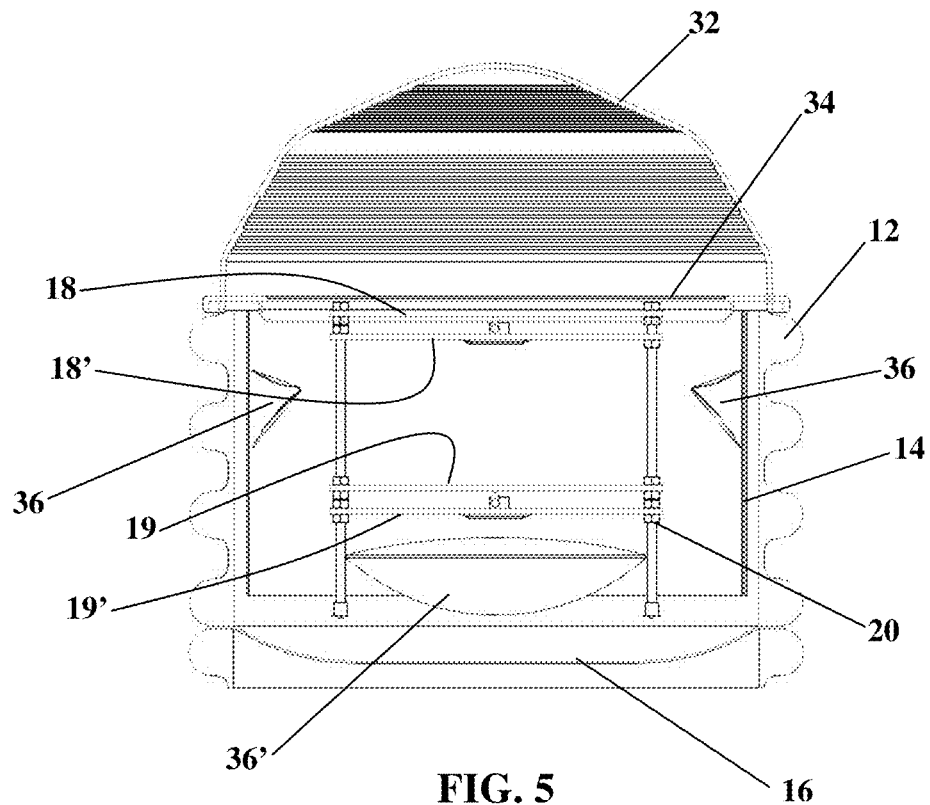
FIG. 5 is a left-side elevation, vertical cross-section of the rendering shown in FIG. 4
Figure 6:
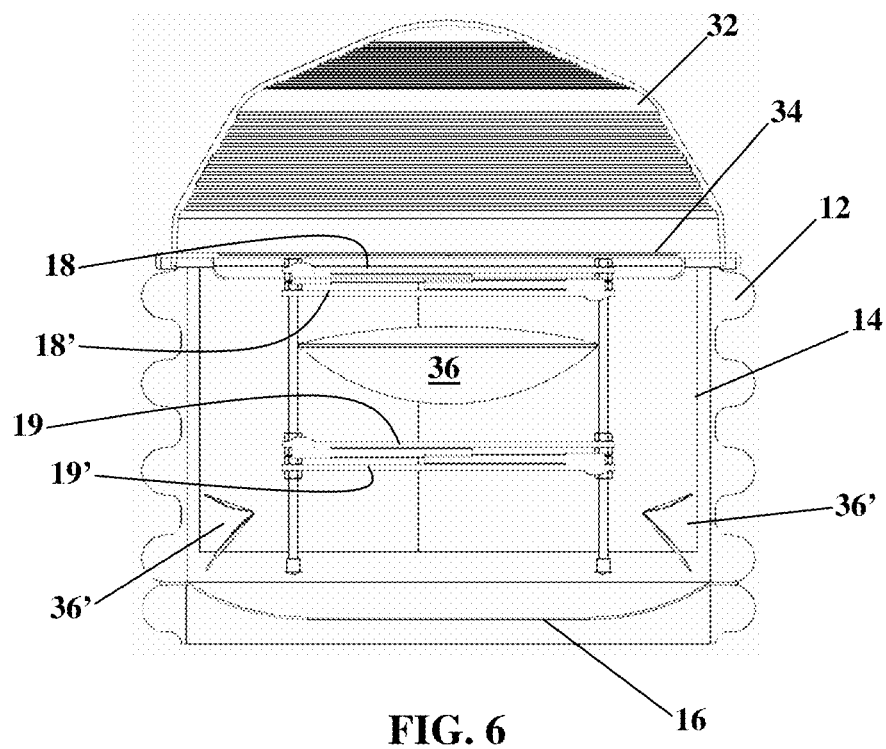
FIG. 6 is a right-side elevation, vertical cross-section of the rendering shown in FIG. 4
Figure 7:
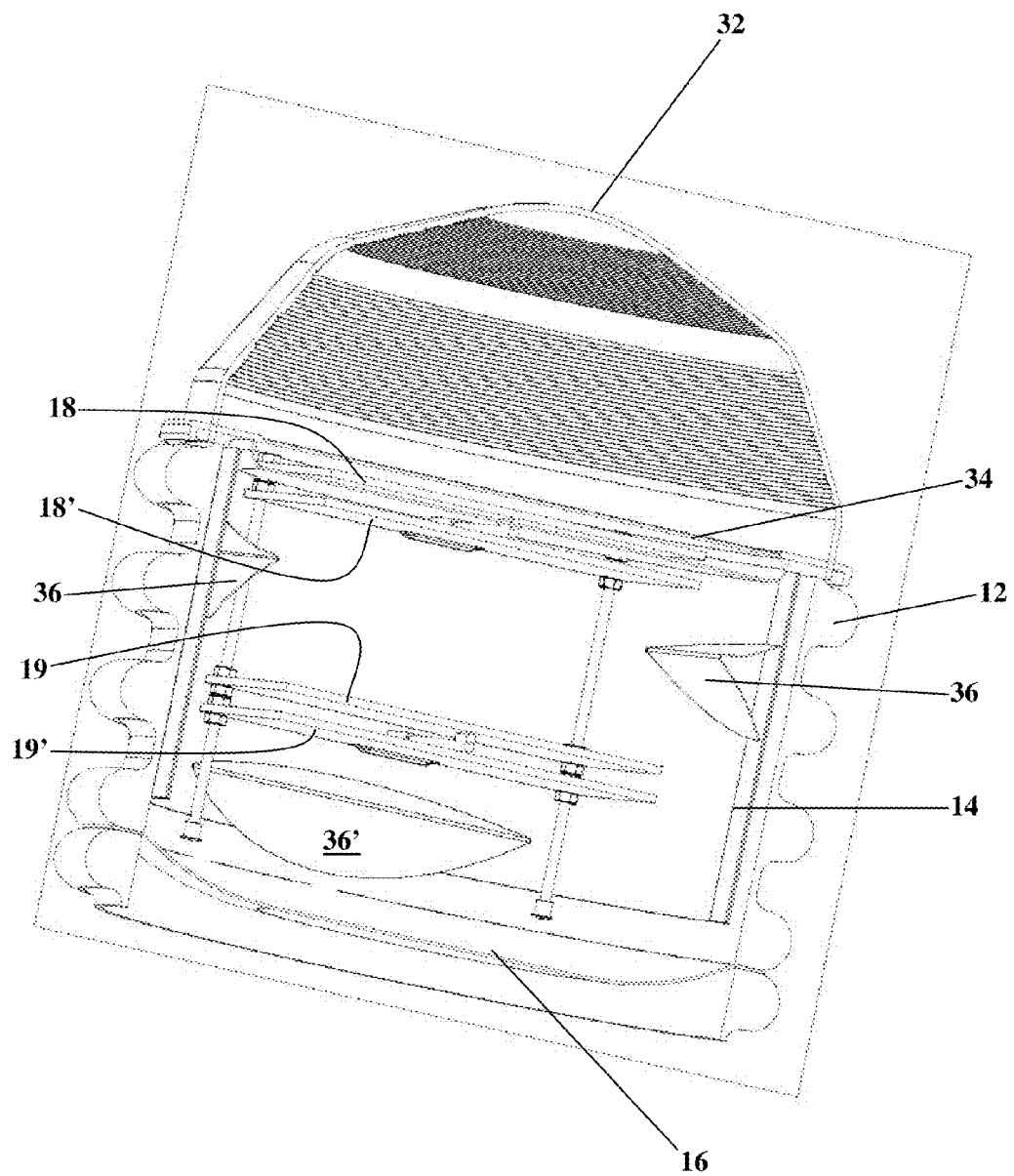
FIG. 7 is another vertical, perspective cross-section of the rendering shown in FIG. 3, but from a different angle of view.

Referring now to FIGS. 3 through 7, these figures depict a second version 30 of the subject device. FIG. 3 is a perspective rendering of the second version 30 of the device. FIG. 4 is a vertical cross-section (in perspective) through the rendering shown in FIG. 3. FIG. 5 is a left-side elevation, vertical cross-section of the rendering shown in FIG. 4. FIG. 6 is a right-side elevation, vertical cross-section of the rendering shown in FIG. 4. FIG. 7 is another vertical, perspective cross-section of the rendering shown in FIG. 3, but from a different angle of view. Again the device includes a housing 12, depicted as a cylinder.

As in the first version, the second version 30 comprises a cylindrical housing or case 12 having inner and outer surfaces and top and bottom faces encloses a plurality of solar panels 18, 18', 19, and 19'. See FIGS. 4-7. Again, a circumferential sidewall reflector 14 is disposed on or proximate to the inner surface of the housing. Preferably, the sidewall reflector 14 covers all or substantially all of the inner surface of the housing 12. A bottom reflector 16 covers the bottom face of the cylindrical housing 12. In the second version of the device, the top face of the housing is covered by a dome lens 32 and a fresnel lens 34. In combination, the dome lens 32 and the fresnel lens 34 are dimensioned and configured to maximize the light that impinges (directly or via refraction and/or reflection) onto solar panels 18, 18', 19, and 19'. The solar panels (and their electrical connecting leads, omitted for clarity) are fixed (preferably reversibly) within the housing via fasteners 20, omitted for clarity in FIG. 4, but shown in FIGS. 5, 6, and 7.

As best shown in FIG. 4, the fresnel lens 34 preferably surrounds and encapsulates all of the uppermost solar panel 18. In this fashion, the fresnel both maximizes the output from solar panel 18, and also serves to transmit light further within housing 12 so that the light refracted through the fresnel has an opportunity to contact the other solar panels within the housing.

Referring specifically to FIGS. 5, 6, and 7, the second version of the invention further comprises a plurality of circumferentially positionable, functional devices such as wedge-shaped reflectors 36 and 36'. The wedge-shaped reflectors are preferably disposed in pairs on the inner surface of the housing 12, or integral with or on the surface of the sidewall reflector 14. (For illustration, the reflectors 36 and 36' are shown in the figures as two, 180° opposed pairs.) The wedge-shaped reflectors are dimensioned, configured and disposed to maximize reflection both upward and downward, thereby to maximize the amount of light that contacts the active surfaces of solar panels 18, 18', 19, and 19'. Thus, each wedge-shaped reflector has an upper surface and a lower surface. Depending on the shape and size of the solar panels within the device, the upper and lower surfaces of the wedge-shaped reflectors may be flat, convex, concave, or any combination thereof. In a preferred version, the wedge-shaped reflectors 36 and 36' are rotatably mounted to the inner surface of the housing 12, thereby allowing the upper and lower surfaces of any given reflector to switch positions simply by rotating the reflector. The wedge-shaped reflectors are rotatable along one or two axes and can be directed by an integrated circuit controller. This provides maximum flexibility in directing solar energy to its desired destination within the light chamber. Referring to FIGS. 5 and 7 specifically, the two upper wedge-shaped reflectors 36 are disposed 180° from each other around the inner circumference of the housing 12. The two reflectors 36 are dimensioned and configured to maximize the amount of light that impacts solar panels 18' and 19. In similar fashion, referring to FIG. 6, the two lower wedge-shaped reflectors 36' are disposed 180° from each other, as well as 90° offset from the upper wedge-shaped reflectors 36. The two reflectors 36' are dimensioned and configured to maximize the amount of light that impacts solar panel 19 by direct reflection and via multiple reflection in combination with bottom reflector 16.

Note that the 180° opposition and 90° offset of the wedge-shaped reflectors are preferred geometries only. The upper wedge-shaped reflectors 36 could, for example, comprise three individual reflectors spaced evenly about the inner surface of the housing 12, each individual reflector 36 occupying 60° of the inner circumference of the housing. The lower wedge-shaped reflectors 36' would then also comprise three individual reflectors spaced evenly about the inner surface of the housing 12, each individual reflector 36' occupying 60° of the inner circumference of the housing and offset 60° from the upper wedge-shaped reflectors.

In combination, sidewall reflector 14, bottom reflector 16, wedge-shaped reflectors 36 and 36', dome lens 32 and fresnel lens 34 are configured, and function, to direct a vastly increased amount of light onto the solar panels 18, 18', 19, and 19'.

Motion control, automated and/or manual, is an important and often critical issue in maximizing electrical output from solar panels and arrays. It is generally known that conventional photovoltaic systems employing precise solar tracking can produce up to a 40% increase in the amount of light available for conversion to electricity and heat as compared to fixed installations that do no track the motion of the sun. Thus, as shown in FIGS. 10 and 11, a large plurality of light chambers 30 according to the present invention are disposed into a two-axis solar tracker, 40. The solar tracker 40 is of conventional design, utilizing orthogonal stepper motors 42 and 44 (see FIG. 11) to tilt the tracker so that solar rays impact the light chambers 30 at the most efficient angle. This is particularly important because the daily rotation of the earth, coupled with the earth's annual orbit around the sun, results in a huge variation in the angle of incidence of sunlight with respect to a single point on the earth. The solar tracker may be manually directed (not preferred) or automatically directed by automated controls (much preferred). Solar trackers and related control circuitry and motors are available from a large number of national and international suppliers, including Array Technologies, Inc. (Albuquerque, N. Mex., USA). These trackers can either track the sun directly or the portion of the sky which is producing the most useable light. The latter type of tracker is often used when environmental conditions preclude access to direct sunlight. Advanced "expert system-linked," integrated circuit-delivered, motion-control solar trackers are available commercially from suppliers such as Aerotech, Inc. (Pittsburgh, Pa., USA). A two-axis tracker is preferred. However, for geographical locations closer to the equator, a one-axis tracker will suffice. At more northerly or southerly latitudes, a two-axis tracker is preferred to maximize the amount of sunlight entering the light box.

Figure 12:
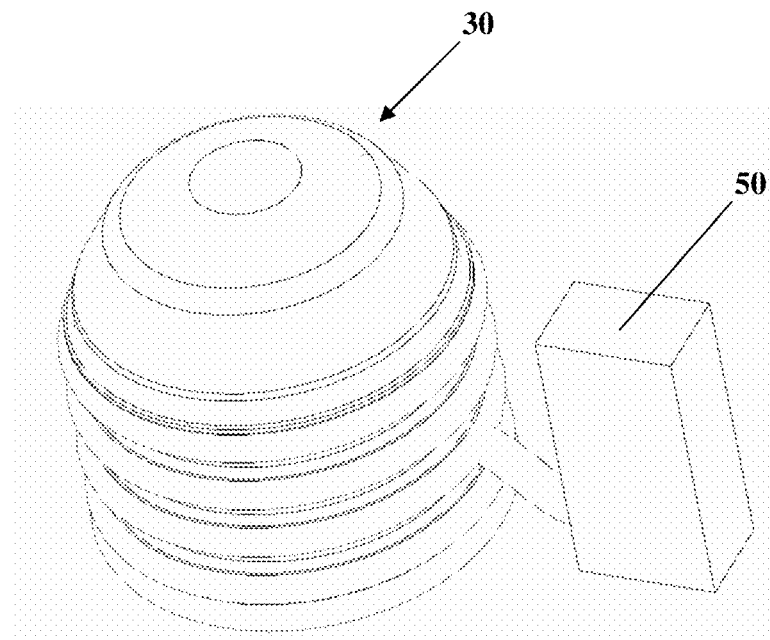
FIG. 12 is a perspective rendering of a light chamber according to the present invention including a heat sink or heat exchanger 50.
Figure 13:
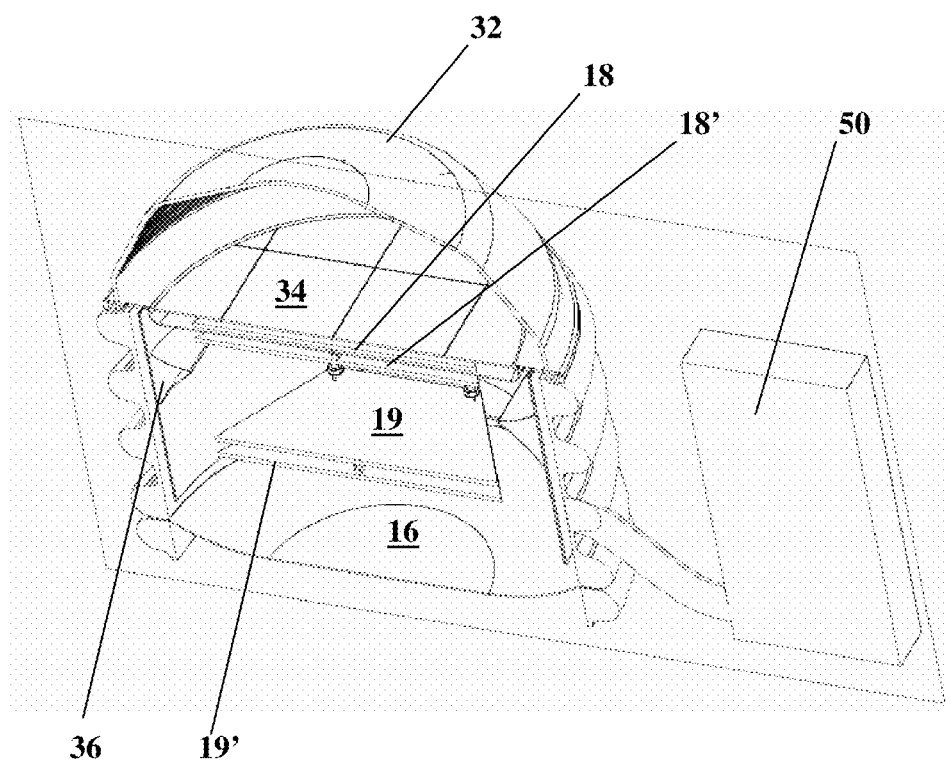
FIG. 13 is a vertical cross-section (in perspective) through the rendering shown in FIG. 12.

In addition to electricity, the light chamber according to the present invention will also generate a significant amount of heat, which can be used for any purpose. To that end, FIGS. 12 and 13 depict a light chamber 30 according to the present invention, interfaced with a heat sink or heat exchanger 50. Thus, for example, the heat exchanger 50 could be used to heat water or any other liquid, gas, or solid. The heat sink or heat exchanger 50 may be of any design, either now known or developed in the future. Thus, the heat exchanger 50 might be a monolithic block of material having a high heat capacity. Or the heat exchanger might be of a tubular, counter-current design, wherein a closed loop of coolant is circulated within the heat exchanger. In this design, heat generated within the light chamber 30 is transferred to the coolant in the closed loop, and the coolant is circulated to whatever area requires heating, such as an insulated water tank (not shown). Heat exchangers are well known and can be purchased from a very large number of commercial suppliers, including American Industrial Heat Transfer Inc. (Zion, Ill., USA) and Flatplate, Inc. (York, Pa., USA).

It is understood that the invention is not confined to the particular construction and arrangement of parts herein illustrated and described, but embraces such modified forms thereof as come within the scope of the claims.

What is claimed is:

1. A light chamber comprising:
   a housing having an upper end, a lower end, and an inner surface;
   a plurality of planar photovoltaic panels disposed in registration within the housing, wherein each photovoltaic panel comprises an upper face and a lower face;
   a plurality of wedge-shaped reflectors mounted in pairs to the inner surface of the housing, a first pair of wedge-shaped reflectors mounted proximate to the an upper end of the housing and a second pair of wedge-shaped reflectors mounted proximate to the lower end housing, wherein each wedge-shaped reflector is rotatable along one or two axes for direct alignment with incoming light and is configured to reflect light entering the housing onto the lower face of at least one of the photovoltaic panels;

an integrated circuit controller configured to rotate the wedge-shaped reflectors;

a dome lens affixed to the upper end of the housing;

a Fresnel lens disposed between the dome lens and the photovoltaic panels;

a first reflector disposed around all or substantially all of the inner surface of the housing; and a second reflector disposed at or near the lower end of the housing and configured to reflect light entering the housing onto the lower face of at least one of the photovoltaic panels.

2. The light chamber of claim 1, wherein the housing is circular in cross-section and the first pair of wedge-shaped reflectors is mounted 180° opposed from each other, and the second pair of wedge-shaped reflectors is mounted 180° opposed from each other and 90° offset form the first pair of wedge-shaped reflectors.

3. The light chamber of claim 1, wherein the fresnel lens completely encapsulates at least one of the photovoltaic panels.

4. The light chamber of claim 1, wherein the wedge-shaped reflectors are rotatably mounted to the inner surface of the housing.

5. The light chamber of claim 1, further comprising a heat exchanger operationally connected to it.

6. A light chamber comprising:
   a housing having an upper end, a lower end, and an inner surface;
   a dome lens affixed to the upper end of the housing;
   a Fresnel lens disposed within the housing;
   a first reflector disposed around all or substantially all of the inner surface of the housing;
   a second reflector disposed at or near the lower end of the housing and configured to reflect light entering the housing toward the upper end of the housing;
   a plurality of wedge-shaped reflectors rotatable along one or two axes for direct alignment with incoming light and mounted to the inner surface of the housing; and
   an integrated circuit controller configured to rotate the wedge-shaped reflectors.

7. The light chamber of claim 6, wherein the housing is circular in cross-section and the wedge-shaped reflectors comprise a first pair of wedge-shaped reflectors mounted 180° opposed from each other, and a second pair of wedge-shaped reflectors mounted 180° opposed from each other and 90° offset form the first pair of wedge-shaped reflectors.

8. The light chamber of claim 6, further comprising a heat exchanger operationally connected to it.

* * * * *